United States Patent
Abdelfattah et al.

(10) Patent No.: US 10,110,175 B1
(45) Date of Patent: Oct. 23, 2018

(54) PREVENTING DISTORTION IN A DIFFERENTIAL POWER AMPLIFIER

(71) Applicant: QUALCOMM Incorporated, San Diego, CA (US)

(72) Inventors: Khaled Abdelfattah, Laguna Hills, CA (US); Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/599,771

(22) Filed: May 19, 2017

(51) Int. Cl.
  *H03F 3/45* (2006.01)
  *H03F 1/32* (2006.01)
  *H03F 3/08* (2006.01)
  *H03F 3/213* (2006.01)

(52) U.S. Cl.
  CPC ......... *H03F 1/3247* (2013.01); *H03F 1/3211* (2013.01); *H03F 3/087* (2013.01); *H03F 3/213* (2013.01); *H03F 3/45932* (2013.01)

(58) Field of Classification Search
  CPC ............. H03F 3/45; H03F 2203/45008; H03F 2203/45011; H03F 2203/45012; H03F 2203/45014; H03F 2203/45016
  USPC .................................................. 330/258, 259
  See application file for complete search history.

(56) References Cited

U.S. PATENT DOCUMENTS

| | | | |
|---|---|---|---|
| 6,946,907 B2 | 9/2005 | Tai et al. | |
| 7,400,173 B1 | 7/2008 | Kwong et al. | |
| 8,248,164 B2 | 8/2012 | Jordan et al. | |
| 8,310,308 B1 * | 11/2012 | Ginsburg | H03F 3/45179 330/258 |
| 8,773,178 B2 | 7/2014 | Van Den Berg et al. | |
| 9,231,538 B1 | 1/2016 | Birkeland et al. | |
| 2010/0052785 A1 | 3/2010 | Ishii | |

FOREIGN PATENT DOCUMENTS

| | | |
|---|---|---|
| EP | 2058944 A1 | 5/2009 |
| GB | 2113030 A | 7/1983 |
| WO | 2007056730 A2 | 5/2007 |

OTHER PUBLICATIONS

International Search Report and Written Opinion—PCT/US2018/028408—ISA/EPO—dated Jul. 6, 2018.

* cited by examiner

*Primary Examiner* — Steven J Mottola
(74) *Attorney, Agent, or Firm* — Colby Nipper/Qualcomm

(57) ABSTRACT

Various aspects of this disclosure describe reducing distortion of a power amplifier by coupling a common mode signal, such as determined from a voltage supply signal of the power amplifier or output of the power amplifier, to an input of the power amplifier. A resistive digital-to-analog converter (DAC) can be coupled to the power amplifier, and a common mode signal is modulated onto differential reference voltages of the DAC, causing the common mode signal to exist at both the input and output of the power amplifier at approximately the same time. Consequently, current flowing at differential inputs of the power amplifier due to the common mode component drops to zero, causing distortions due to common mode to differential mode conversion to be reduced.

30 Claims, 10 Drawing Sheets

700

Obtain, with a common mode circuit, a common mode signal for a power amplifier having a pair of inputs, the common mode signal determined from a voltage supply signal of the power amplifier
702

Process, with a feedback circuit, the common mode signal to produce a feedback signal
704

Apply, with an input circuit connected to the pair of inputs, the feedback signal to the input circuit to cause signals derived from the feedback signal to be added to signals on the pair of inputs, respectively
706

Obtain, with a common mode circuit, a common mode signal for a power amplifier having a pair of inputs, the common mode signal based on a differential output signal of the power amplifier
902

Process, with a feedback circuit, the common mode signal to produce a feedback signal
904

Apply, with an input circuit connected to the pair of inputs, the feedback signal to the input circuit to cause signals derived from the feedback signal to be added to signals on the pair of inputs, repsectively
906

FIG. 9

PREVENTING DISTORTION IN A DIFFERENTIAL POWER AMPLIFIER

FIELD OF THE DISCLOSURE

The present disclosure relates to reducing distortion of a differential power amplifier, such as distortions caused by common mode to differential mode conversion. Distortion is reduced by coupling a common mode signal derived from the power amplifier's output, such as a common mode reference signal based on a supply voltage of the power amplifier, to the input of the power amplifier.

BACKGROUND

Mobile devices have not only become ubiquitous, but also their processing abilities and demands placed on the resources in the mobile device have increased with each new generation of technology. For instance, though lithium ion (Li-Ion) batteries reduce form factor and provide power for many mobile devices, demands for higher power on the mobile device have grown to the point that sufficient power cannot be achieved from the limited voltage supplied by Li-Ion batteries. One example that can drive power requirements of the mobile device is output volume of a power amplifier, such as for a loudspeaker or headphone connected to or comprising the mobile device.

To meet power requirements for a mobile device, often a boost circuit is used to boost a supply level provided from a battery to a higher level, and use the boosted signal as the supply voltage for the power amplifier. To improve efficiency, the output of the boost circuit is varied as a function of the output signal of the power amplifier, such as via envelope tracking in a class-H fashion. Furthermore, to increase signal swing, a common mode reference signal provided to the power amplifier is often set to half of the boost circuit output. Consequently, the common mode signal is also dependent on the output signal of the power amplifier.

Common mode signals of a differential power amplifier are converted to differential mode signals (CM-DM) due to mismatches in the power amplifier circuit. For example, mismatches occur in resistors connected to the power amplifier due to process variations, such as between input resistors and between feedback resistors connected to the differential inputs of the power amplifier. Any mismatch results in different currents flowing at the positive and negative inputs to the power amplifier, which are amplified by the power amplifier, causing CM-DM conversion. This CM-DM conversion increases distortion, including total harmonic distortion (THD), particularly second harmonic distortion, and degrades power supply rejection ratio (PSRR). These adverse effects can be exacerbated due to the common mode signal's dependence on the output signal of the power amplifier.

Accordingly, traditional methods attempt to reduce CM-DM induced-distortion in the power amplifier by using trimming resistors of the power amplifier to reduce mismatches. For instance, trimming resistors can be placed in parallel or in series with resistors connected to the power amplifier in an attempt to match effective resistances caused by the combinations of the trimming resistors and the resistors connected to the power amplifier. However, the addition of trimming resistors can be costly in terms of increased area and manufacturing time to adjust the trimming. Furthermore, matching the effective resistances can be difficult, especially when the trimming resistors are small in size. This difficulty can result in further mismatch that induces CM-DM distortion, even though trimming resistors have been added.

SUMMARY

This summary is provided to introduce a selection of concepts in a simplified form that are further described below in the detailed description. This summary is not intended to identify key features or essential features of the claimed subject matter.

In one or more implementations, a circuit operation method is described. The method comprises obtaining, with a common mode circuit, a common mode signal for a power amplifier having a pair of inputs, the common mode signal determined from a voltage supply signal of the power amplifier. The method also comprises processing, with a feedback circuit, the common mode signal to produce a feedback signal. The method also comprises applying, with an input circuit connected to the pair of inputs, the feedback signal to the input circuit to cause signals derived from the feedback signal to be added to signals on the pair of inputs, respectively.

In one or more implementations, a circuit for preventing distortion is described. The circuit comprises a common mode circuit configured to obtain a common mode signal for a power amplifier having a pair of inputs, the common mode signal determined from a voltage supply signal of the power amplifier. The circuit also comprises a feedback circuit configured to process the common mode signal to produce a feedback signal. The circuit also comprises an input circuit connected to the pair of inputs configured to apply the feedback signal and cause signals derived from the feedback signal to be added to signals on the pair of inputs, respectively.

In one or more implementations, a device for preventing distortion is described. The device comprises means for obtaining a common mode signal for a power amplifier having a pair of inputs. The device also comprises means for processing the common mode signal to produce a feedback signal. The device also comprises means for applying the feedback signal to an input circuit connected to the pair of inputs to cause signals derived from the feedback signal to be added to signals on the pair of inputs, respectively.

In one or more implementations, a system for preventing distortion is described. The system comprises a differential power amplifier having a pair of inputs. The system also comprises a common mode circuit configured to obtain a common mode signal for the differential power amplifier, the common mode signal determined from a voltage supply signal of the differential power amplifier. The system also comprises a feedback circuit that processes the common mode signal to produce a feedback signal. The system also comprises an input circuit connected to the pair of inputs configured to apply the feedback signal and cause signals derived from the feedback signal to be added to signals on the pair of inputs, respectively.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

FIG. 7 is a flow diagram depicting an example procedure in accordance with one or more aspects of the disclosure.

FIG. 9 is a flow diagram depicting an example procedure in accordance with one or more aspects of the disclosure.

DETAILED DESCRIPTION

Figure 1:
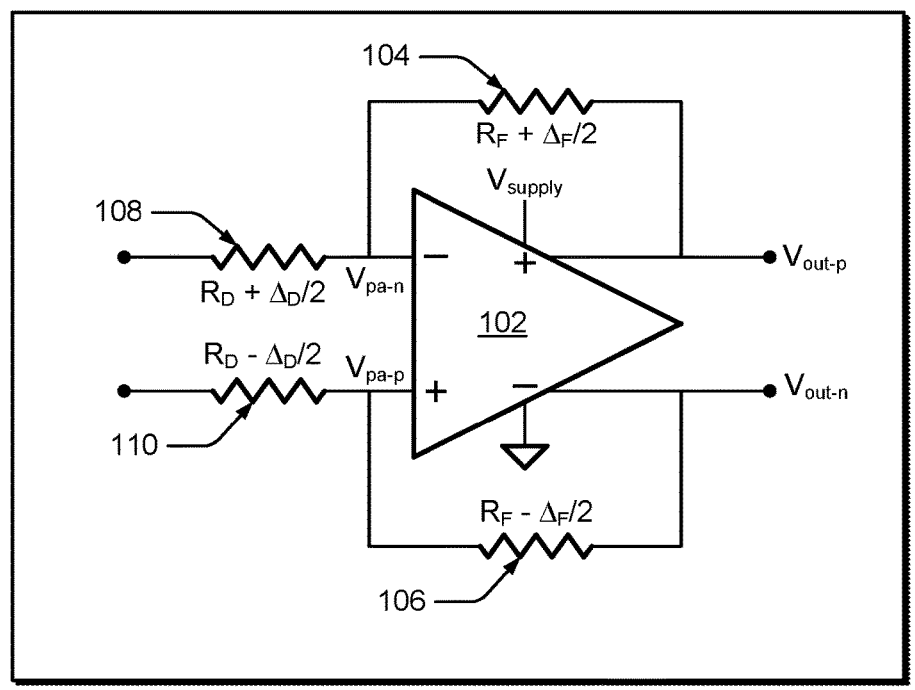
FIG. 1 illustrates an example differential power amplifier circuit with mismatched resistors in accordance with one or more aspects of the disclosure.

Common mode signals of a differential power amplifier are converted to differential mode signals (CM-DM) due to mismatches in the power amplifier circuit. For example, mismatches occur in resistors connected to the power amplifier due to process variations, such as between input resistors and between feedback resistors connected to the differential inputs of the power amplifier. Any mismatch can result in different currents flowing at the positive and negative inputs to the power amplifier, which are amplified by the power amplifier, causing CM-DM conversion. This CM-DM conversion increases distortion, including total harmonic distortion (THD), particularly second harmonic distortion, and degrades power supply rejection ratio (PSRR). These adverse effects can be exacerbated when the common mode signal is varied as a function of the output signal of the power amplifier.

In contrast to methods that place trimming resistors in parallel or in series with resistors connected to the power amplifier in an attempt to match effective resistances caused by the combinations of the trimming resistors and the resistors connected to the power amplifier, this disclosure describes methods and circuits for preventing distortion caused by CM-DM conversion by coupling a common mode signal derived from the power amplifier's output, such as a common mode reference signal based on a supply voltage of the power amplifier, to the input of the power amplifier. This causes approximately the same common mode signal to be present at the output of the amplifier and at the input of the amplifier at approximately the same time. Consequently, current due to the common mode component drops to near zero at the inputs of the power amplifier, so that CM-DM and associated distortions are reduced, regardless of mismatch of resistors, compared to other CM-DM compensation methods, such as using trimming resistors. Therefore, the disclosed methods and circuits operate to reduce CM-DM induced distortion even in the presence of mismatched resistors. Accordingly, the disclosed methods constitute an improvement over methods that add trimming resistors, because the costly process of adding trimming resistors can be avoided using the disclosed methods.

Furthermore, the common mode signal can be coupled to the input of the power amplifier for both analog and digital inputs. In one example, a differential analog signal is supplied to the power amplifier, and the common mode signal is added to both sides of the differential analog signal, such as with a resistive summing circuit, or operational amplifier summing circuit. In another example, an input signal is digital, and the common mode signal is added to positive and negative reference voltages of a digital-to-analog converter (DAC) that converts the digital input to a differential analog input to the power amplifier.

In the following discussion, example systems including input circuits, feedback circuits, boost circuits, and common mode circuits of a differential power amplifier are described. Techniques that elements of the example system may implement, and a device on which elements of the example system may be embodied, are also described. Consequently, performance of the example procedures is not limited to the example system and the example system is not limited to performance of the example procedures. Any reference made with respect to the example system, or elements thereof, is by way of example only and is not intended to limit any of the aspects described herein.

Example Power Amplifier Systems

FIG. 1 illustrates an example differential power amplifier circuit 100 with mismatched resistors in accordance with one or more aspects of the disclosure. The circuit 100 includes differential amplifier 102 (e.g., an operational amplifier). The amplifier 102 comprises differential inputs denoted with minus and plus signs for negative (e.g., inverting) and positive (e.g., non-inverting) inputs, respectively. Furthermore, the amplifier 102 includes a positive power connection (denoted with a plus sign) connected to a supply voltage, $V_{supply}$, such as +5.0 volts, or any suitable voltage value. The amplifier 102 also includes a negative power connection (denoted with a negative sign) connected to ground. The amplifier 102 can be any suitable type of differential amplifier, such as cascade, cascode, folded, shunted, combinations thereof, and the like. Furthermore, the amplifier 102 may comprise any suitable type and number of transistors, such as one or more bipolar junction transistor or field effect transistor. Moreover, transistors of the amplifier 102 can be fabricated in any suitable process, such as NMOS, PMOS, combinations thereof, and the like.

The amplifier 102 is configured with feedback resistors 104 and 106. For instance, the feedback resistor 104 connects the positive differential output $V_{out-p}$ to the negative differential input $V_{pa-n}$, and the feedback resistor 106 connects the negative differential output $V_{out-n}$ to the positive differential input $V_{pa-p}$.

The amplifier 102 is also configured with input resistors 108 and 110. For instance, the input resistor 108 connects the negative differential input $V_{pa-n}$ to a first analog input, and the input resistor 110 connects the positive differential input $V_{pa-p}$ to a second analog input. In this example, the input resistors 108 and 110 can model a resistive digital-to-analog converter (R-DAC) connected to the inputs of the power amplifier, as well as resistors connected to an analog input. For instance, the input resistors 108 and 110 may comprise physical resistors, such as when a differential analog input is supplied for input to the amplifier 102 via the first and second analog inputs. Additionally or alternatively, the input resistors 108 and 110 may comprise resistors of an RDAC, such as when a digital input is supplied to the circuit 100 (discussed in more detail below).

Mismatch between the input resistors 108 and 110 is illustrated in FIG. 1 by modeling the value of the input resistor 108 as $R_D+\Delta_D/2$ and the value of the input resistor 110 as $R_D-\Delta_D/2$, where $\Delta_D$ is an amount of mismatch in the input resistors 108 and 110, split equally between positive and negative inputs. Mismatch between the feedback resistors 104 and 106 is illustrated in FIG. 1 by modeling the value of the feedback resistor 104 as $R_F+\Delta_F/2$ and the value of the feedback resistor 106 as $R_F-\Delta_F/2$, where $\Delta_F$ is an amount of mismatch in the feedback resistors 104 and 106, split equally between positive and negative feedback paths. Mismatch between resistors can occur when resistors are designed to be the same or intended to be the same, but due to manufacturing, are not precisely the same.

The differential outputs of the amplifier 102 can be written as composed of a common mode component shared on both positive and negative components of the output signal, and a differential component split equally between positive and negative components of the output signal, or $$V_{out-p} = V_{com} + \frac{V_{diff}}{2}$$

$$V_{out-n} = V_{com} - \frac{V_{diff}}{2}$$

where $V_{cm}$ is a common mode component and $V_{diff}$ is a differential component.

Because the input resistors 108 and 110 form respective voltage dividers with the feedback resistors 104 and 106, the amount of CM-DM conversion can be expressed as a function of the resistor values, or $$\frac{V_{diff}}{V_{com}} = \frac{\sqrt{\left(\frac{\Delta_F}{R_F}\right)^2 + \left(\frac{\Delta_D}{R_D}\right)^2}}{\left(1+\frac{R_D}{R_F}\right)}.$$

Any mismatch (e.g., non-zero $\Delta_F$ or non-zero $\Delta_D$) results in CM-DM conversion, causing increased distortion, such a total harmonic distortion (THD), particularly second harmonic distortion, and a degradation in power supply rejection ratio (PSRR). For instance, mismatch results in different currents flowing at the positive and negative inputs to the amplifier 102 due to the common mode component, which are amplified by the amplifier 102, and cause distortion.

Having considered a discussion of the differential power amplifier circuit 100 with mismatched resistors, consider now a discussion of an example power amplifier circuit.

Figure 2:
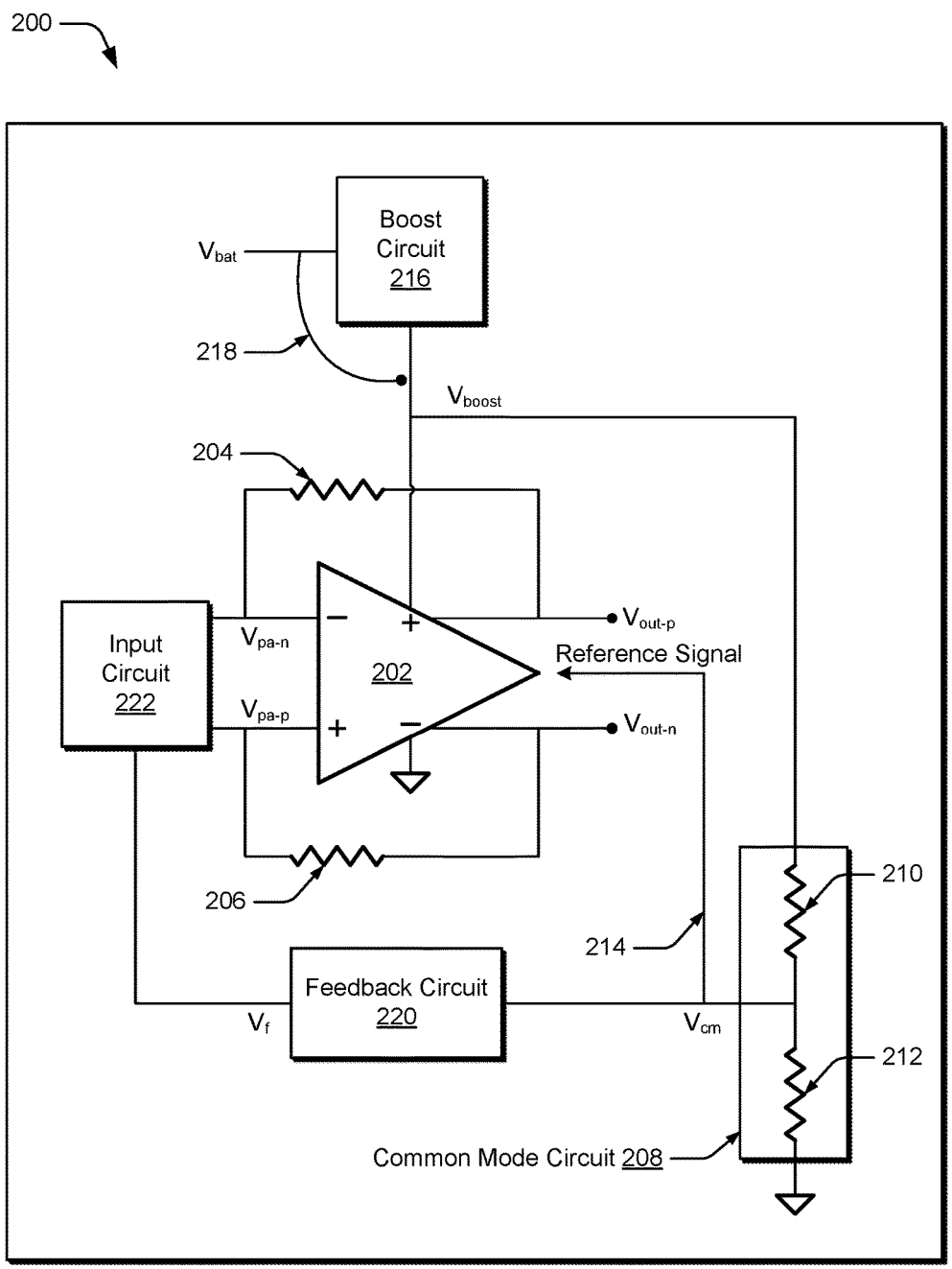
FIG. 2 illustrates an example power amplifier circuit in accordance with one or more aspects of the disclosure.

FIG. 2 illustrates an example power amplifier circuit 200 in accordance with one or more aspects of the disclosure. The circuit 200 mitigates the distortion caused by CM-DM conversion by coupling the common mode component $V_{com}$ at the output of the power amplifier (e.g., amplifier 202) to the input of the power amplifier. Thus, since approximately the same common mode signal is present at the output of the power amplifier and at the input of the power amplifier at approximately the same time, current due to the common mode component drops to zero at the differential inputs of the power amplifier. Hence, CM-DM is reduced, regardless of mismatch of resistors.

The circuit 200 includes amplifier 202. The amplifier 202 can be any suitable type of amplifier. For instance, the amplifier 102 in FIG. 1 is an example of the amplifier 202 in FIG. 2. The amplifier 202 is configured with feedback resistors 204 and 206. The feedback resistor 204 connects the positive differential output $V_{out-p}$ of the amplifier 202 to the negative differential input $V_{pa-n}$ of the amplifier 202. On the other side of the amplifier 202, the feedback resistor 206 connects the negative differential output $V_{out-n}$ to the positive differential input $V_{pa-p}$ of the amplifier 202.

The circuit 200 comprises common mode circuit 208. In the example in FIG. 2, the common mode circuit 208 includes resistors 210 and 212. The pair of resistors (e.g., resistors 210 and 212) form a voltage divider of a provided voltage (e.g., the boost signal $V_{boost}$ or the battery signal $V_{bat}$, depending on the state of jumper 218) to produce a common mode reference signal 214, denoted by $V_{cm}$. In one example, the value of the resistor 210 is equal to the value of the resistor 212 so that the common mode reference signal 214 is half the boost signal, or $V_{cm}=1/2 \cdot V_{boost}$. The common mode reference signal 214 is provided to the amplifier 202. The amplifier 202 contains circuitry (not shown), such as a control loop, that accepts the common mode reference signal 214 and adjusts a common mode component (e.g., $V_{com}$ described above) at the output of the amplifier 202 to match the common mode reference signal 214. Thus, common mode reference signal 214 ($V_{cm}$) corresponds to the common mode component ($V_{com}$) at the output of the amplifier 202.

The example common mode circuit 208 in FIG. 2 is one example of a common mode circuit that provides a common mode signal corresponding to the common mode component at the output of the amplifier 202. The common mode circuit 208 can, in general, be any suitable circuitry that provides a common mode signal that corresponds to the common mode component at the output of the amplifier 202. For instance, another example of the common mode circuit 208 is a summing circuit that sums the differential outputs of the power amplifier 202 (e.g., $V_{out-p}+V_{out-n}$) to remove the differential component $V_{diff}$ and retain the common mode component $V_{com}$.

The boost signal $V_{boost}$ is provided from boost circuit 216. To meet power requirements for a device that includes circuit 200, often the boost circuit 216 is used to boost a supply level provided from a source, such as a battery, (denoted as $V_{bat}$ in FIG. 2) to a higher level (e.g., $V_{boost} \geq V_{bat}$). The boost signal $V_{boost}$ is connected as the supply voltage for the amplifier 202, enabling the amplifier 202 to produce more power than if the un-boosted battery signal (e.g., $V_{bat}$) was used to supply the amplifier 202. To improve efficiency, the output of the boost circuit can be varied as a function of the output signal of the amplifier 202, such as via envelope tracking in a class-H fashion.

In some devices containing the circuit 200, the boost circuit 216 may not be needed, since some devices don't have as demanding power requirements (e.g., require high output power of an amplifier). For example, a small device belonging to the Internet of Things (TOT), such as a wearable device, household appliance, alarm system, and the like, may not require a boost circuit. For such cases that do not require a boost circuit, the circuit 200 includes jumper 218. Alternatively, such cases can omit the boost circuit 216. When the jumper 218 is enabled, the boost circuit 216 is bypassed (e.g., disabled or removed from circuit 200) and the node containing the battery signal $V_{bat}$ is connected to the output node of the boost circuit 216 so that $V_{boost}=V_{bat}$. In this example without a boost circuit, the battery signal $V_{bat}$ is supplied to the positive power supply of the amplifier 202, and to the common mode circuit 208 to generate the common mode reference signal 214. The jumper 218 can be any suitable type of jumper, such as a wire, a connection, a metal strip, a bridge, and the like.

Figure 5:
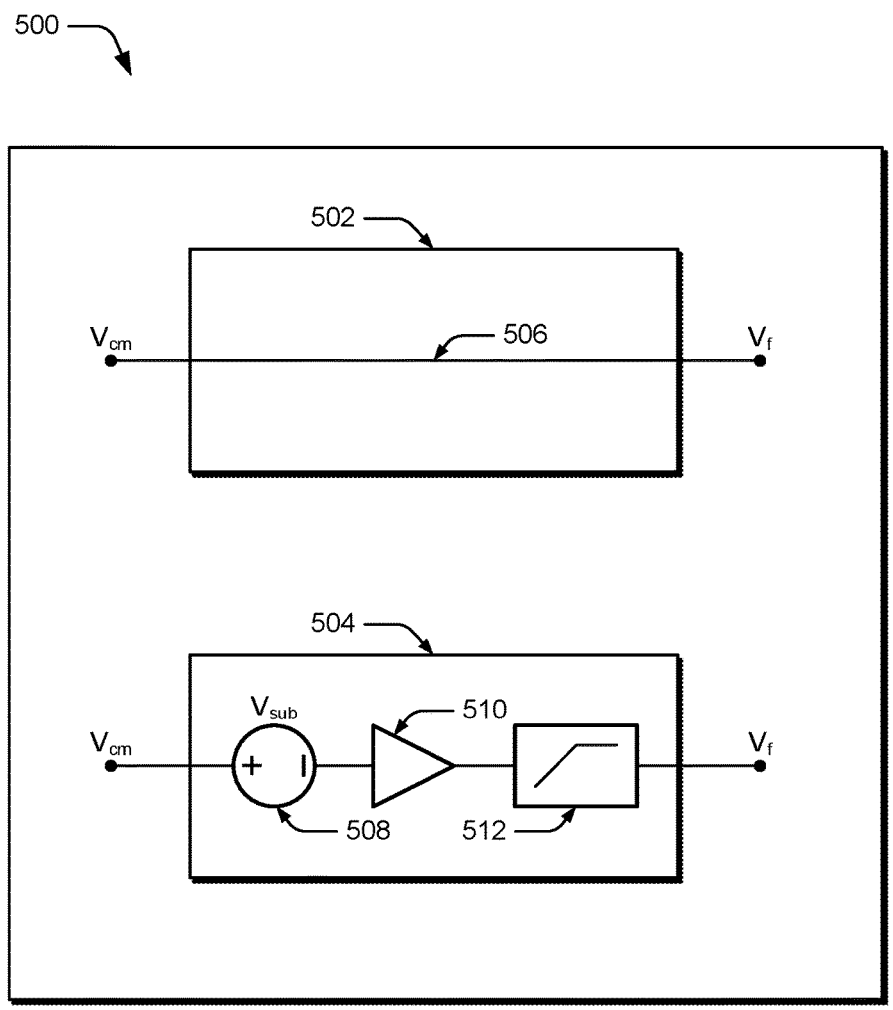
FIG. 5 illustrates example feedback circuits in accordance with one or more aspects of the disclosure.

The circuit 200 also includes feedback circuit 220. The feedback circuit 220 includes circuitry that processes the common mode reference signal 214 to produce feedback signal $V_f$. The feedback circuit 220 can include any suitable type of circuitry that conditions the common mode reference signal 214 to be coupled to signals on the differential inputs to the amplifier 202. For example, the feedback circuit 220 can include filters (e.g., low pass, high pass, or band pass filters). The feedback circuit 220 may also include level shifters to shift the common mode reference signal 214 up or down in voltage. The feedback circuit 220 may also include adders or subtractors to add or subtract, respectively, a signal from or to the common mode reference signal 214. The feedback circuit 220 may also include limiters that limit the common mode reference signal 214 to a range of voltages, soft compressors that inhibit the common mode reference signal 214 beyond a certain range of voltages, buffers, amplifiers, combinations thereof, and the like. Circuits 502 and 504 (discussed below in more detail) in FIG. 5 are examples of the feedback circuit 220.

Figure 3:
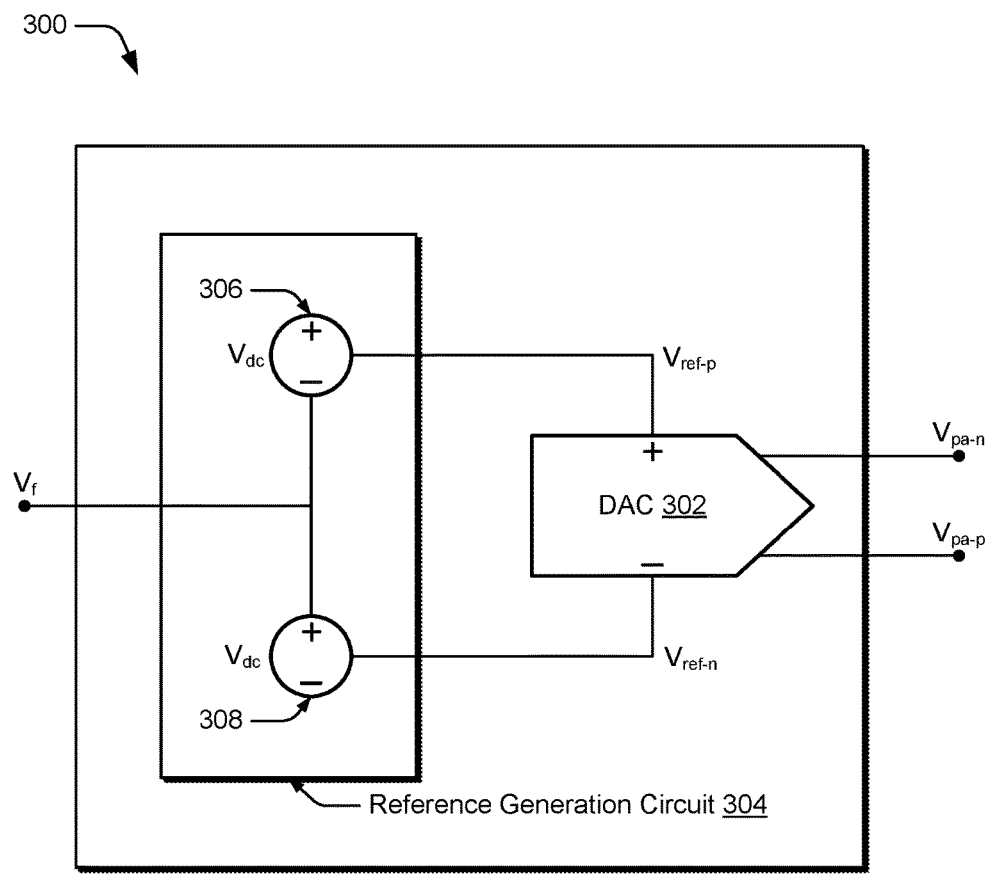
FIG. 3 illustrates an example input circuit in accordance with one or more aspects of the disclosure.

The circuit 200 also includes input circuit 222. The input circuit 222 includes circuitry that couples the feedback signal $V_f$ from the feedback circuit 220 to an input signal for the amplifier 202. In one example, an input signal is a differential analog signal, such as from an analog output of a radio, and the input circuit contains summing circuitry to sum the feedback signal $V_f$ with each component of the differential analog signal to form differential inputs (e.g., $V_{pa-n}$ and $V_{pa-p}$) to the power amplifier 202. In another example, the input signal is a digital signal, and the input circuit 222 includes a DAC (e.g., an R-DAC) to convert the digital input to differential analog input signals to the amplifier 202. In this example, the input circuit 222 also includes a reference generation circuit to modulate the feedback signal $V_f$ onto positive and negative reference voltages for the DAC, causing the feedback signal $V_f$ to be added to the differential analog input signals to the amplifier 202. Circuit 300 in FIG. 3 is an example of the input circuit 222 in FIG. 2.

By adding a common mode signal, such as a signal derived from the feedback signal $V_f$, to the inputs of the amplifier 202, approximately the same common mode signal is present at the output of the amplifier 202 and at the input of the power amplifier 202 at approximately the same time. Accordingly, current in the circuit 200 due to the common mode component $V_{com}$ drops to zero at the differential inputs $V_{pa-n}$ and $V_{pa-p}$ of the amplifier 202. Since no current due to the common mode component $V_{com}$ flows at the differential inputs, the current is not amplified by the amplifier 202 to induce CM-DM conversion and cause the associated distortion. No matching of the feedback resistors 204 and 206 with trimming resistors is needed in the circuit 200. In one example, the feedback resistors 204 and 206 are not matched in resistance value.

Accordingly, the circuits described herein constitute an improvement over circuits that add trimming resistors in an attempt to match combinations of resistors, such as by adding resistors in parallel to each of the feedback resistors 204 and 206 to match the effective resistance (e.g., the parallel combinations) in each of the feedback paths. Instead, the circuits described herein operate to directly reduce the cause of CM-DM conversion, and thus mitigate the associated distortion, by forcing the currents induced by a common mode component at the differential inputs to the amplifier to be zero.

Having considered a discussion of the example power amplifier circuit 200, consider now a discussion of an example input circuit.

Example Circuits for Power Amplifier Systems

FIG. 3 illustrates an example input circuit 300 in accordance with one or more aspects of the disclosure. The input circuit 300 is an example of the input circuit 222 in FIG. 2, such as when the input is a digital input. The input circuit 300 includes DAC 302 and reference generation circuit 304. The DAC 302 can be a resistive DAC that is supplied one or more digital words (not shown) to produce differential analog outputs connected to the differential inputs $V_{pa-p}$ and $V_{pa-n}$ of the amplifier 202 in FIG. 2. The DAC 302 includes a connection for a positive reference voltage (denoted with a plus) and a connection for a negative reference voltage (denoted with a minus).

The reference generation circuit 304 includes level shifters 306 and 308, and produces a positive reference voltage $V_{ref-p}$ connected to the positive reference voltage of the DAC 302, and a negative reference voltage $V_{ref-n}$ connected to the negative reference voltage of the DAC 302. The level shifters 306 and 308 shift the feedback signal $V_f$ up and down, respectively, by a prescribed amount denoted by $V_{dc}$ to form the reference voltages for the DAC 302. For instance, the level shifters 306 and 308 form the reference voltages according to $$V_{ref-p} = V_f + V_{dc}$$

$$V_{ref-n} = V_f - V_{dc}.$$

The voltage $V_{dc}$ can be any suitable value. In one example, $V_{dc}$ is 0.8 volts.

Because the feedback signal $V_f$ is added to both reference voltages of the DAC 302, the effective DAC reference is held constant (e.g., $V_{ref-p} - V_{ref-n}$ =constant). The feedback signal $V_f$ is coupled to the inputs of the power amplifier 202 by the differential reference voltages of the DAC 302, and because the common mode exists at approximately the same time at the amplifier 202 input and output, CM-DM conversion and associated distortions are reduced.

Having considered a discussion of the example input circuit for digital inputs 300, consider now a discussion of an example reference generation circuit.

Figure 4:
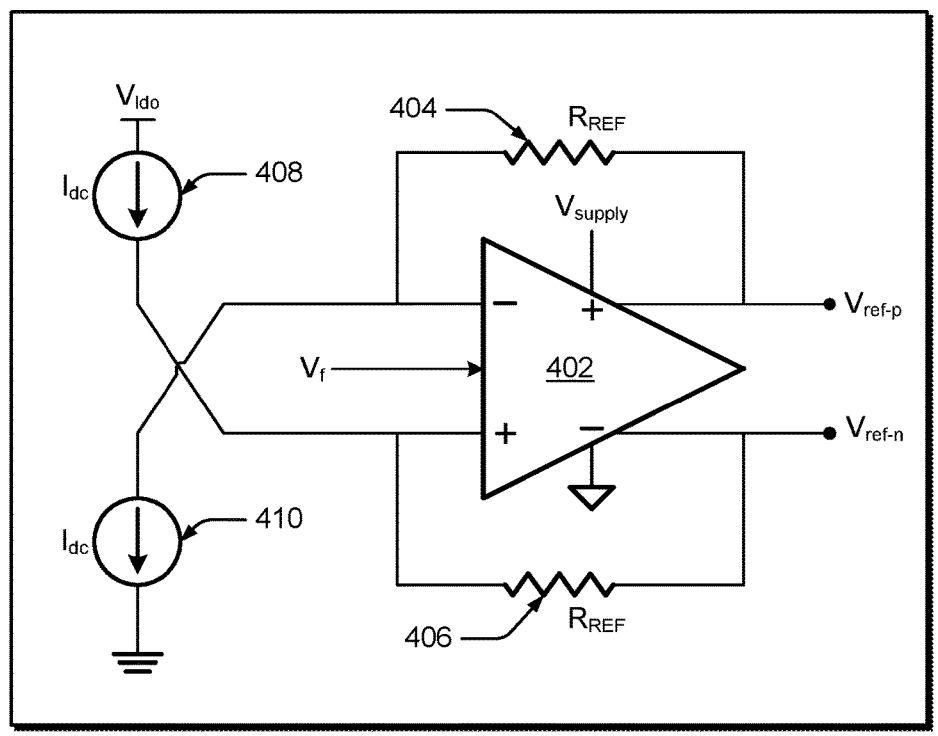
FIG. 4 illustrates an example reference generation circuit in accordance with one or more aspects of the disclosure.

FIG. 4 illustrates an example reference generation circuit 400 in accordance with one or more aspects of the disclosure. The reference generation circuit 400 is an example of circuitry that can implement the reference generation circuit 304 in FIG. 3.

The reference generation circuit 400 includes differential amplifier 402 having a positive supply terminal (denoted by a plus) connected to a suitable supply voltage ($V_{supply}$) and a negative supply terminal (denoted by a minus) connected to ground. The differential amplifier 402 is configured to generate positive reference voltage $V_{ref-p}$ and negative reference voltage $V_{ref-n}$ at its differential outputs. For instance, the differential amplifier 402 is configured with a first feedback resistor 404 connected from the positive output of the differential amplifier 402 to the negative (e.g., inverting) input of the differential amplifier 402, and a second feedback resistor 406 is connected from the negative output of the differential amplifier 402 to the positive (e.g., non-inverting) input of the differential amplifier 402. Both the feedback resistors 404 and 406 are set to a same nominal value, denoted as $R_{REF}$.

The feedback signal $V_f$ from the feedback circuit 220 in FIG. 2 is supplied to a reference input for a common mode loop contained in the differential amplifier 402. The common mode loop forces the common mode component of the differential output of the differential amplifier 402 to be equal to the reference input of the common mode loop. A first current source 408 is connected to a voltage from a low dropout regulator (denoted as $V_{ldo}$) and sources current of amount $I_{dc}$ to the positive input of the differential amplifier 402. A second current source 410 is connected to ground and sinks current of amount $I_{dc}$ from the negative input of the differential amplifier 402. Hence, the reference generation circuit 400 level-shifts the feedback signal $V_f$ up and down an amount $V_{dc}=I_{dc}\cdot R_{REF}$ to generate reference voltages for the DAC 302 according to $$V_{ref\text{-}p}=V_f+I_{dc}\cdot R_{REF}$$

$$V_{ref\text{-}n}=V_f-I_{dc}\cdot R_{REF}.$$

Having considered a discussion of the example reference generation circuit 400, consider now a discussion of example feedback circuits.

FIG. 5 illustrates example feedback circuits 500 in accordance with one or more aspects of the disclosure. The feedback circuits 500 include feedback circuit 502 and feedback circuit 504, both of which are an example of the feedback circuit 220 in FIG. 2.

The feedback circuit 502 is configured to set the feedback signal $V_f$ as the common mode reference signal 214. Accordingly, the feedback circuit 502 includes jumper 506 that can connect the common mode reference signal 214 provided from the common mode circuit 208 to the feedback signal $V_f$ generated by the feedback circuit 502. The jumper 506 can be any suitable type of jumper, such as a wire, a connection, a metal strip, a bridge, and the like. When the feedback circuit 502 is used, the amplifier 202 in FIG. 2 is configured in a unity gain feedback loop to couple the common signal at the output of the amplifier 202 to the input of the amplifier 202.

The feedback circuit 504 includes level shifter 508 configured to subtract the signal $V_{sub}$ from the common mode reference signal 214. For instance, the output of level shifter 508 is given by $V_{cm}-V_{sub}$. The signal $V_{sub}$ can be any suitable signal. In one example, the signal $V_{sub}$ is a predetermined voltage level, such as 0.25 volts, that can also be programmed, such as in a range from 0 to 5 volts in quarter volt steps. In another example, the signal $V_{sub}$ is derived from a battery signal, such as the battery signal $V_{bat}$ supplied to the boost circuit 216 in FIG. 2. For instance, the battery signal can be scaled, such as by a factor of two, and filtered, such as with a low pass filter. The resulting signal, $F(\alpha \cdot V_{bat})$, where $F(\cdot)$ denotes processing by a filter and multiplication by a denotes scaling, is set as $V_{sub}$ and subtracted from $V_{cm}$ to form $V_f$ in the feedback circuit 504.

In one example, when subtracting the signal $V_{sub}$ from the common mode reference signal 214, the level shifter 508 is configured to add an additional voltage signal to the result of the subtraction, the additional voltage signal being a direct current (DC) component.

The feedback circuit 504 also includes buffer 510 used to separate the level shifter 508 from a limiting circuit 512. The limiting circuit 512 can be any suitable limiting circuit that limits or inhibits its input signal outside a range of voltages in any suitable way. In one example, the limiting circuit 512 includes a hard limiter that clamps the signal to a range of voltages. For instance, if the signal input to the limiting circuit 512 is above a threshold level, such as 4 volts, then the signal is set to the threshold level. In another example, the limiting circuit 512 includes a soft compressor that inhibits its input signal beyond a certain range of voltages.

For instance, above a predetermined threshold voltage, such as 3 volts, a nonlinear compression curve is applied to the input signal that attenuates the input signal when the input signal is above the predetermined threshold voltage. Furthermore, the limiting circuit 512 can be omitted from the feedback circuit 504, such as by excluding the limiting circuit 512 from the feedback circuit 504, or by programming the limiting circuit 512 to suppress limiting functionality (e.g., apply a linear compression curve).

The order of circuit elements in the feedback circuit 504 can be according to any suitable order, and are not limited to the order illustrated in FIG. 5. For instance, the limiting circuit 512 can be applied before the level shifter 508 to prevent the level shifter 508 from being overdriven.

Having considered a discussion of the example feedback circuits 500, consider now a discussion of an example subtraction circuit.

Figure 6:
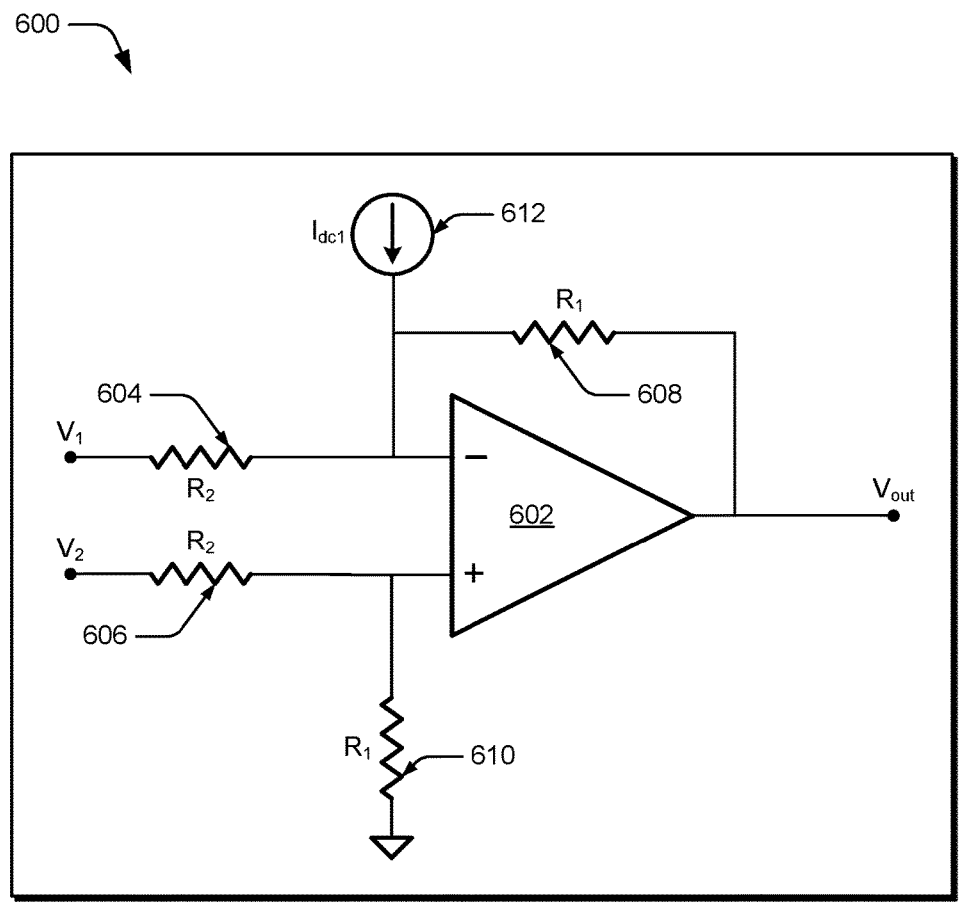
FIG. 6 is an example subtraction circuit in accordance with one or more aspects of the disclosure.

FIG. 6 illustrates example subtraction circuit 600 in accordance with one or more aspects of the disclosure. The subtraction circuit 600 is an example of a circuit that can implement the level shifter 508 in FIG. 5, used to subtract signal $V_{sub}$ from the common mode reference signal 214 when forming the feedback signal $V_f$.

The subtraction circuit 600 includes operational amplifier 602. The operational amplifier 602 is configured with input resistors 604 and 606 connected to the negative (e.g., inverting) input and positive (e.g., non-inverting) input of the operational amplifier 602, respectively. Both the input resistors 604 and 606 are set to the same nominal value $R_2$. A first input $V_1$ is connected to the resistor 604, and a second input $V_2$ is connected to the resistor 606. The subtraction circuit 600 is configured to subtract input $V_1$ from input $V_2$.

The operational amplifier 602 is also configured with a feedback resistor 608 connected from the operational amplifier's 602 single-ended output to the inverting input of the operational amplifier 602. Another resistor 610 of equal value $R_1$ to the resistor 608 is connected from the non-inverting input of the operational amplifier 602 to ground. A current source 612 of current value $I_{dc1}$ sources current to the inverting input of the operational amplifier 602.

Configured in this way, the output of the operational amplifier 602 can be expressed as $$V_{out} = (V_2 - V_1) \cdot \frac{R_2}{R_1} + (I_{dc1} \cdot R_1).$$

Accordingly, the feedback circuit 220 can include the subtraction circuit 600 implemented with an operational amplifier configured to produce an output voltage based on a difference of input voltages and a ratio of resistors. For instance, by setting $R_1=R_2$, the subtraction circuit 600 is configured to subtract input signal input $V_1$ from input signal $V_2$, and add a DC component of $I_{dc1} \cdot R_1$ to the result. By using the subtraction circuit 600, the feedback circuit 220 can be enabled to subtract a signal, such as a filtered signal derived from a battery, from a common mode signal of the power amplifier output, such as the common mode reference signal 214, and add a DC term into the result of the subtraction.

Having considered discussions of example amplifiers and circuits, consider now example procedures in accordance with one or more aspects.

Example Procedures

FIG. 7 illustrates an example procedure 700 for reducing distortion by coupling a common mode reference signal to an input of a power amplifier in accordance with one or more aspects. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks. In at least some aspects the procedure may be performed by a suitably configured device or devices, such as a device or devices comprising the power amplifier circuit 200.

A common mode circuit obtains a common mode signal for a power amplifier having a pair of inputs (block 702). The common mode signal is determined from a voltage supply signal of the power amplifier. In one example, the common mode signal of the power amplifier is a reference common mode signal used to set a common mode component at a differential output of the power amplifier. The reference common mode signal can be a scaled version of a voltage supply signal to the power amplifier.

The voltage supply signal of the power amplifier can be a boost signal from a boost circuit configured to boost a battery signal for the power amplifier. Furthermore, the voltage supply signal of the power amplifier can be varied based on an output signal of the power amplifier.

In one example, the power amplifier is configured with a pair of feedback resistors, a respective feedback resistor connected from a respective output of the power amplifier to a respective one of the pair of inputs, and the feedback resistors are not matched in resistance value (e.g., the feedback resistors are mismatched and not trimmed). Mismatch between resistors can occur when resistors are designed to be the same or intended to be the same, but due to manufacturing, are not precisely the same.

A feedback circuit processes the common mode signal to produce a feedback signal (block 704). In one example, the feedback circuit is configured to set the feedback signal as the common mode signal, such as with a jumper or a trace on a chip or board. The feedback circuit can comprise a subtraction circuit configured to subtract a first voltage signal from the common mode signal, the first voltage signal being a fixed voltage. In one example, the subtraction circuit is configured to subtract a first voltage signal from the common mode signal, the first voltage signal being set to zero volts based on a lack of available voltage supply signals.

Furthermore, the feedback circuit can comprise a subtraction circuit configured to subtract a first voltage signal from the common mode signal, the first voltage signal being determined from a battery signal used to determine the voltage supply signal of the power amplifier. For instance, the first voltage can be determined from the battery signal by scaling the battery signal and filtering the scaled battery signal with a low pass filter.

Moreover, the feedback circuit can comprise a subtraction circuit configured to subtract a first voltage signal from the common mode signal and add a second voltage signal to the result of the subtraction, the second voltage signal being a DC component. The subtraction circuit can be implemented with an operational amplifier configured to produce an output voltage based on a difference of input voltages and a ratio of resistors, and the operational amplifier can be coupled to a current source used to produce a DC component at the output voltage of the operational amplifier.

An input circuit connected to the pair of inputs applies the feedback signal to the input circuit to cause signals derived from the feedback signal to be added to signals on the pair of inputs, respectively (block 706). In one example, the input circuit comprises a DAC, such as a resistive DAC, and applying the feedback signal comprises level-shifting the feedback signal up to form a positive reference voltage, level-shifting the feedback signal down to form a negative reference voltage, and applying the positive reference voltage and the negative reference voltage as reference voltages to the DAC. For instance, the input circuit can comprise a level-shifting circuit including an operational amplifier and a pair of current sources of approximately equal current value each being coupled to a respective input of the operational amplifier. The level-shifting circuit can be configured to perform level-shifting of the feedback signal up and down an amount determined by the equal current value.

Moreover, the input circuit can comprise a respective adding circuit connected to each input of the pair of inputs, each respective adding circuit configured to sum the feedback signal with the signals on the pair of inputs.

Figure 8:
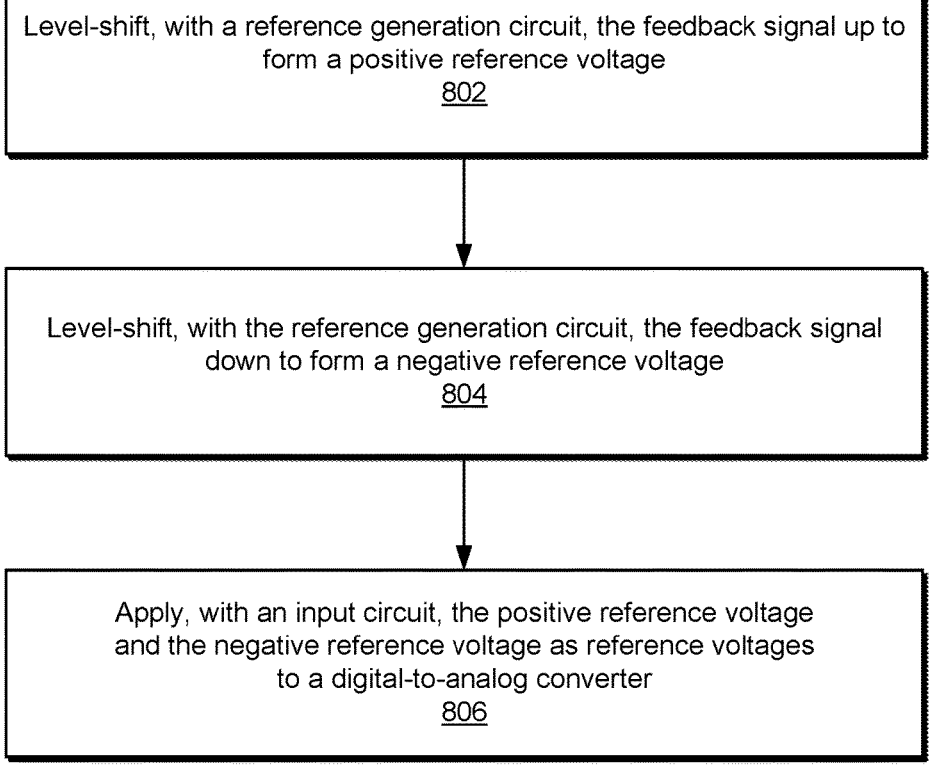
FIG. 8 is a flow diagram depicting an example procedure in accordance with one or more aspects of the disclosure.

FIG. 8 illustrates an example procedure 800 for applying a feedback signal to an input circuit in accordance with one or more aspects. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks. In at least some aspects the procedure may be performed by a suitably configured device or devices, such as a device or devices comprising the power amplifier circuit 200.

A reference generation circuit level-shifts up a feedback signal to form a positive reference voltage (block 802). The reference generation circuit level-shifts down the feedback signal to form a negative reference voltage (block 804). The reference generation circuit can include a level-shifting circuit such as an operational amplifier and a pair of current sources of approximately equal current value each being coupled to a respective input of the operational amplifier. The level-shifting circuit can be configured to perform level-shifting of the feedback signal up and down an amount determined by the equal current value. The feedback signal can comprise at least a portion of a common mode component of a power amplifier output signal.

An input circuit applies the positive reference voltage and the negative reference voltage as reference voltages to a DAC (block 806). In one example, the input circuit includes the reference generation circuit, and the reference generation circuit applies the positive reference voltage and the negative reference voltage as reference voltages to the DAC. By coupling the positive reference voltage and the negative reference voltage modulated with the feedback signal to the reference voltages of the DAC, differential outputs of the DAC include the feedback signal. The DAC can be an R-DAC with differential outputs connected to differential inputs of a power amplifier.

FIG. 9 illustrates an example procedure 900 for reducing distortion by coupling a common mode reference signal to an input of a power amplifier in accordance with one or more aspects. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks. In at least some aspects the procedure may be performed by a suitably configured device or devices, such as a device or devices comprising the power amplifier circuit 200.

A common mode circuit obtains a common mode signal for a power amplifier having a pair of inputs (block 902).

The common mode signal is determined from a differential output signal of the power amplifier. For instance, the common mode circuit may include a circuit (e.g., an adder) that forms the common mode signal from two components of the differential output signal of the power amplifier. In one example, the common mode signal of the power amplifier is formed by summing signals (e.g., components) of the differential output signal. For instance, signals on each of the differential outputs of the power amplifier can be summed to form a common mode signal. Additionally or alternatively, the common mode signal of the power amplifier can be derived from a reference common mode signal used to set a common mode component at the differential output of the power amplifier.

A feedback circuit processes the common mode signal to produce a feedback signal (block 904). The feedback circuit can contain any suitable type of circuitry to process the common mode signal, as discussed earlier. In one example, the feedback circuit comprises a subtraction circuit configured to subtract a first voltage signal from the common mode signal, the first voltage signal being one of a fixed voltage or a signal determined from a battery signal used to determine the voltage supply signal of the power amplifier.

An input circuit connected to the pair of inputs applies the feedback signal to the input circuit to cause signals derived from the feedback signal to be added to signals on the pair of inputs (block 706). The input circuit can contain any suitable type of circuitry to receive the feedback signal and cause the signals derived from feedback signal to be added to signals on the pair of inputs, as discussed earlier. In one example, the input circuit comprises a DAC, such as a resistive DAC, and applying the feedback signal comprises level-shifting the feedback signal up to form a positive reference voltage, level-shifting the feedback signal down to form a negative reference voltage, and applying the positive reference voltage and the negative reference voltage as reference voltages to the DAC.

The methods described herein constitute an improvement over methods that add trimming resistors in an attempt to match combinations of resistors, such as by adding resistors in parallel to each of feedback resistors to match the effective resistance (e.g., the parallel combinations) in each of the feedback paths. The methods described herein do not require adding costly trimming resistors. Instead, the methods described herein operate to directly reduce the cause of CM-DM conversion by forcing the currents induced by a common mode component at the differential inputs to the amplifier to be zero. Accordingly, distortions associated with CM-DM conversion are reduced, even with mismatched resistors.

Having considered a discussion of example methods for reducing distortion by coupling a common mode reference signal to an input of a power amplifier, consider now a discussion of a device on which aspects of improving power amplifier distortion by coupling common mode output to an input of the power amplifier can be implemented.

Figure 10:
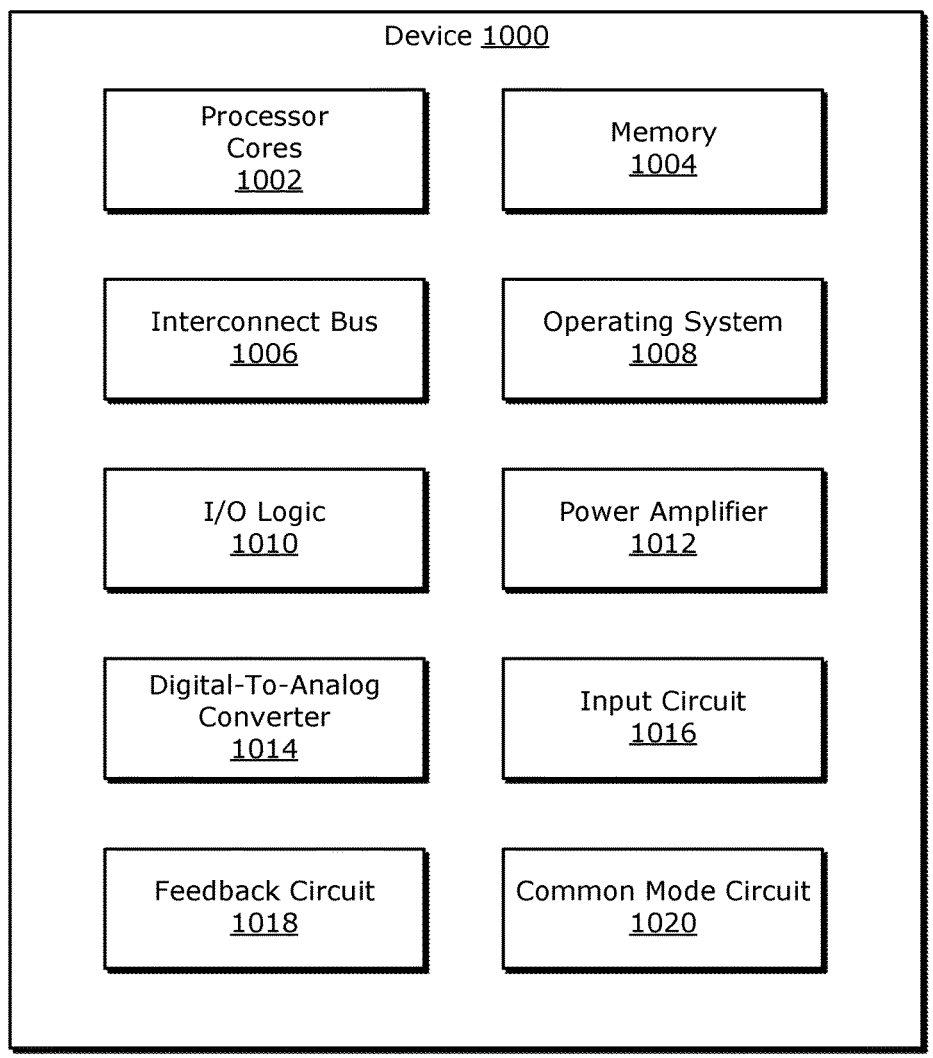
FIG. 10 illustrates an example device that can be employed for one or more implementations described herein.

FIG. 10 illustrates an example device 1000, which includes components capable of implementing aspects of reducing distortion by coupling a common mode reference signal to an input of a power amplifier. The device 1000 may be implemented as, or in, any suitable electronic device, such as a modem, broadband router, access point, cellular phone, smart-phone, tablet, gaming device, laptop computer, desk top computer, net book, set-top-box, smart-phone, network-attached storage (NAS) device, cell tower, satellite, cable head-end, work station, testing station, server, test and measurement equipment, combinations thereof, and/or any other device that may reduce distortion by coupling a common mode reference signal to an input of a power amplifier. The device 1000 can comprise one or more devices, and is illustrated as a single device in FIG. 10 for simplicity. For instance, the device 1000 may be implemented on multiple devices connected over a network.

The device 1000 may be integrated with a microprocessor, storage media, I/O logic, data interfaces, logic gates, a transmitter, a receiver, circuitry, firmware, software, and/or combinations thereof to provide communicative or processing functionalities. The device 1000 may include a data bus (e.g., cross bar or interconnect fabric) enabling communication between the various components of the device. In some aspects, components of the device 1000 may interact via the data bus to implement aspects of reducing distortion by coupling a common mode reference signal to an input of a power amplifier.

In this particular example, the device 1000 includes processor cores 1002 and memory 1004. The memory 1004 may include any suitable type of memory, such as volatile memory (e.g., DRAM), non-volatile memory (e.g., flash), cache, and the like. In the context of this disclosure, the memory 1004 is implemented as a storage medium, and does not include transitory propagating signals or carrier waves. An interconnect bus 1006 is used to allow components of the device 1000 to interact, such as to access the memory 1004. The memory 1004 can store data and processor-executable instructions of the device 1000, such as operating system 1008 and other applications. The processor cores 1002 may execute the operating system 1008 and other applications from the memory 1004 to implement functions of the device 1000, the data of which may be stored to the memory 1004 for future access. The device 1000 may also include I/O logic 1010, which can be configured to provide a variety of I/O ports or data interfaces for communication.

The device 1000 also includes power amplifier 1012. The power amplifiers 102 and 202 in FIG. 1 and FIG. 2, respectively, are examples of the power amplifier 1012. The power amplifier 1012 may also include, or be coupled to a boost circuit to boost a supply or battery signal to the power amplifier 1012.

The device 1000 also includes digital-to-analog converter 1014. The DAC 302 in FIG. 3 is an example of the digital-to-analog converter 1014. For instance, the digital-to-analog converter 1014 may be a resistive DAC with differential outputs coupled to differential inputs of the power amplifier 1012.

The device 1000 also includes input circuit 1016. The input circuits 222 and 300 in FIG. 2, FIG. 3, respectively, are examples of the input circuit 1016. The input circuit 1016 may include the DAC 1014. Moreover, the device 1000 includes feedback circuit 1018 and common mode circuit 1020. The feedback circuits 220 and 500 in FIG. 2 and FIG. 5, respectively, are examples of the feedback circuit 1018, and the common mode circuit 208 in FIG. 2 is an example of the common mode circuit 1020.

The input circuit 1016, the feedback circuit 1018, and the common mode circuit 1020 can be configured on the device 1000 to obtain a common mode signal of the power amplifier 1012 determined from a voltage supply signal or output signal of the power amplifier 1012, process the common mode signal, and apply the result to the input of the power amplifier 1012 (e.g., causing the result to be added to signals on differential inputs of the power amplifier 1012).

In one or more exemplary aspects, the functions described may be implemented in hardware, software, firmware, or any combination thereof. If implemented in software, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can comprise RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The terms "component" and "system" are indented to refer to one or more computer related entities, such as hardware, firmware, software, or any combination thereof, as further described above. At times, a component may refer to a process and/or thread of execution that is defined by processor-executable instructions. Alternately or additionally, a component may refer to various electronic and/or hardware entities.

Certain specific aspects are described above for instructional purposes. The teachings of this disclosure have general applicability, however, and are not limited to the specific aspects described above.

What is claimed is:

1. A circuit operation method comprising:
   obtaining a common mode signal for a power amplifier having a pair of inputs, the common mode signal determined from a voltage supply signal of the power amplifier;
   processing the common mode signal to produce a feedback signal; and
   applying the feedback signal to an input circuit to cause signals derived from the feedback signal to be added to signals on the pair of inputs, respectively, by at least forming one or more reference voltages and applying the one or more reference voltages to a digital-to-analog converter of the input circuit.

2. The method as recited in claim 1, wherein the processing the common mode signal includes setting the feedback signal to be the common mode signal.

3. The method as recited in claim 1, wherein the processing the common mode signal includes subtracting a first voltage signal from the common mode signal, the first voltage signal being a fixed voltage.

4. The method as recited in claim 1, wherein the processing the common mode signal includes subtracting a first voltage signal from the common mode signal, the first voltage signal being determined from a battery signal used to determine the voltage supply signal.

5. The method as recited in claim 4, wherein the first voltage is determined from the battery signal by:
   scaling the battery signal; and
   filtering the scaled battery signal with a low pass filter.

6. The method as recited in claim 1, wherein the processing the common mode signal includes subtracting a first voltage signal from the common mode signal and adding a second voltage signal to the result of the subtraction, the second voltage signal being a direct current (DC) component.

7. The method as recited in claim 1, wherein the processing the common mode signal is performed with a circuit implemented with an operational amplifier configured to produce an output voltage based on a difference of input voltages and a ratio of resistors.

8. The method as recited in claim 7, wherein the operational amplifier is coupled to a current source used to produce a DC component at the output voltage of the operational amplifier.

9. The method as recited in claim 1, wherein:
   forming the one or more reference voltages comprises:
      level-shifting the feedback signal up to form a positive reference voltage; and
      level-shifting the feedback signal down to form a negative reference voltage; and
   applying the one or more reference voltages comprises applying the positive reference voltage and the negative reference voltage as reference voltages to the digital-to-analog converter.

10. The method as recited in claim 9, wherein the applying the feedback signal is performed by a level-shifting circuit including an operational amplifier and a pair of current sources of equal current value each being coupled to a respective input of the operational amplifier, the level-shifting circuit configured to perform said level-shifting the feedback signal up and down an amount determined by the equal current value.

11. The method as recited in claim 1, wherein the voltage supply signal of the power amplifier is a boost signal from a boost circuit configured to boost a battery signal for the power amplifier.

12. The method as recited in claim 1, wherein the power amplifier is configured with a pair of feedback resistors, a respective feedback resistor connected from a respective output of the power amplifier to a respective one of the pair of inputs, and the feedback resistors are not matched in resistance value.

13. The method as recited in claim 1, wherein the digital-to-analog converter comprises a resistive digital-to-analog converter.

14. The method as recited in claim 1, wherein the voltage supply signal of the power amplifier is varied based on an output signal of the power amplifier.

15. The method as recited in claim 1, wherein the common mode signal of the power amplifier is a reference common mode signal used to set a common mode component at a differential output of the power amplifier.

16. A circuit for preventing distortion, the circuit comprising:
   a common mode circuit configured to obtain a common mode signal for a power amplifier having a pair of inputs, the common mode signal determined from a voltage supply signal of the power amplifier;

a feedback circuit configured to process the common mode signal to produce a feedback signal; and an input circuit connected to the pair of inputs, the input circuit configured to:
  apply the feedback signal based on one or more reference voltages formed from the feedback signal and applied to a digital-to-analog converter; and
  cause signals derived from the feedback signal to be added to signals on the pair of inputs, respectively.

17. The circuit as recited in claim 16, wherein the digital-to-analog converter comprises a resistive digital-to-analog converter, and wherein the input circuit comprises the resistive digital-to-analog converter and a level-shifting circuit configured to apply the feedback signal comprising:
  level-shifting the feedback signal up to form a positive reference voltage;
  level-shifting the feedback signal down to form a negative reference voltage; and
  applying the positive reference voltage and the negative reference voltage as reference voltages to the digital-to-analog converter.

18. The circuit as recited in claim 17, wherein the level-shifting circuit includes an operational amplifier and a pair of current sources of approximately equal current value each being coupled to a respective input of the operational amplifier, the level-shifting circuit configured to perform the level-shifting of the feedback signal up and down an amount determined by the equal current value.

19. The circuit as recited in claim 16, wherein the feedback circuit comprises a subtraction circuit configured to subtract a first voltage signal from the common mode signal, the first voltage signal being one of a fixed voltage or a signal determined from a battery signal used to determine the voltage supply signal.

20. The circuit as recited in claim 16, wherein the feedback circuit comprises a subtraction circuit configured to subtract a first voltage signal from the common mode signal, the first voltage signal being set to zero volts based on a lack of available voltage supply signals.

21. The circuit as recited in claim 16, wherein the feedback circuit comprises a voltage divider comprising a pair of resistors that divide a voltage down to produce the common mode signal.

22. A device for preventing distortion, the device comprising:
  means for obtaining a common mode signal for a power amplifier having a pair of inputs;
  means for processing the common mode signal to produce a feedback signal; and
  means for applying the feedback signal to an input circuit connected to the pair of inputs to cause signals derived from the feedback signal to be added to signals on the pair of inputs, respectively, by at least forming one or more reference voltages and applying the one or more reference voltages to a digital-to-analog converter of the input circuit.

23. The device as recited in claim 22, wherein the means for obtaining the common mode signal comprises a circuit that forms the common mode signal from two components of a differential output signal of the power amplifier.

24. The device as recited in claim 22, wherein the means for obtaining the common mode signal comprises a circuit that forms the common mode signal from a voltage supply signal of the power amplifier.

25. The device as recited in claim 22, wherein the digital-to-analog converter comprises a resistive digital-to-analog converter, and wherein the input circuit comprises the resistive digital-to-analog converter and a level-shifting circuit configured to perform said applying the feedback signal by:
  level-shifting the feedback signal up to form a positive reference voltage;
  level-shifting the feedback signal down to form a negative reference voltage; and
  applying the positive reference voltage and the negative reference voltage as reference voltages to the digital-to-analog converter.

26. A system for preventing distortion, the system comprising:
  a differential power amplifier having a pair of inputs;
  a common mode circuit configured to obtain a common mode signal for the differential power amplifier, the common mode signal determined from a voltage supply signal of the differential power amplifier;
  a feedback circuit configured to process the common mode signal to produce a feedback signal; and
  an input circuit connected to the pair of inputs, the input circuit configured to:
    apply the feedback signal based on one or more reference voltages formed from the feedback signal and applied to a digital-to-analog converter; and
    cause signals derived from the feedback signal to be added to signals on the pair of inputs, respectively.

27. The system as recited in claim 26, wherein the digital-to-analog converter comprises a resistive digital-to-analog converter, and wherein the input circuit comprises the resistive digital-to-analog converter and a level-shifting circuit configured to apply the feedback signal by:
  level-shifting the feedback signal up to form a positive reference voltage;
  level-shifting the feedback signal down to form a negative reference voltage; and
  applying the positive reference voltage and the negative reference voltage as reference voltages to the digital-to-analog converter.

28. The system as recited in claim 26, wherein the feedback circuit comprises a subtraction circuit configured to subtract a first voltage signal from the common mode signal, the first voltage signal being one of a fixed voltage or a signal determined from a battery signal used to determine the voltage supply signal.

29. The system as recited in claim 26, further comprising a boost circuit configured to boost a battery signal for the differential power amplifier, and wherein the voltage supply signal of the differential power amplifier is a boost signal from the boost circuit.

30. The system as recited in claim 27, wherein the level-shifting circuit includes an operational amplifier and a pair of current sources of approximately equal current value each being coupled to a respective input of the operational amplifier, the level-shifting circuit configured to perform the level-shifting of the feedback signal up and down an amount determined by the equal current value.

* * * * *